United States Patent [19]

Albergo et al.

[11] Patent Number: 5,077,587
[45] Date of Patent: Dec. 31, 1991

[54] LIGHT-EMITTING DIODE WITH ANTI-REFLECTION LAYER OPTIMIZATION

[75] Inventors: Christopher J. Albergo, Penfield; Robert J. Maryjanowski, North Chili; Mary L. Ott, Fairport, all of N.Y.

[73] Assignee: Eastman Kodak Company, Rochester, N.Y.

[21] Appl. No.: 594,792

[22] Filed: Oct. 9, 1990

[51] Int. Cl.$^5$ ............................................. H01L 33/00
[52] U.S. Cl. ..................................... 357/17; 357/16; 357/90; 357/52; 357/54
[58] Field of Search ................. 357/17, 16, 90, 52, 357/52 C, 52 T, 54, 54 N

[56] References Cited

U.S. PATENT DOCUMENTS

| | | | |
|---|---|---|---|
| 3,549,411 | 12/1970 | Bean et al. | 357/52 X |
| 4,227,975 | 10/1980 | Hartman et al. | 204/15 |
| 4,495,514 | 1/1985 | Lawrence et al. | 357/67 |
| 4,617,192 | 10/1986 | Chin et al. | 427/42 |
| 4,942,439 | 7/1990 | Schairer | 357/16 X |
| 4,956,684 | 9/1990 | Urata | 357/17 |
| 5,005,058 | 4/1991 | Tanaka | 357/17 |

*Primary Examiner*—William Mintel
*Attorney, Agent, or Firm*—Norman Rushefsky

[57] ABSTRACT

Improved light output from LED's or the like are obtained by modifying the combined thickness dimensions of a transmissive diffusion mask layer and anti-reflection coating layer at the periphery of the window forming the light-emitting region.

11 Claims, 4 Drawing Sheets

STD PROCESS

OPTIMIZED PROCESS

5,077,587

LIGHT-EMITTING DIODE WITH ANTI-REFLECTION LAYER OPTIMIZATION

BACKGROUND OF THE INVENTION

1. Field of the Invention

The present invention relates to light-emitting diodes, and more particularly, to light-emitting diodes having anti-reflection coatings and to a method of making same.

2. Description Relative to the Prior Art

As text and image information generation and transmission becomes increasingly available in digitized, electronic form, the need for producing hard copies of such information directly with low cost, high speed printers increases. An attractive approach for satisfying this need is in the provision of a high-density, compact, linear array of LEDs used in electronic/optical printers. Besides the obvious advantage of compactness and increased density of light sources, the LED array system promises the advantage of being more reliable and less expensive for such use.

LED arrays are well known in the prior art and are typically used in printheads for electrophotographic copiers or the like. For example, see U.S. Pat. No. 4,885,597 the contents of which are incorporated by this reference. Such a printhead array comprises a row of uniformly spaced LED light sources that can be individually energized to expose a photoreceptor or other image-receiving medium to produce an image pattern. A typical LED printhead array of this type for standard DIN A4 paper dimensions would be about 216 millimeters long and the individual light sources are very small and very closely spaced, e.g. as many as 400 or more sites per linear inch. A complete printhead array comprises a number of individual array chips, each being typically less than 10 millimeters long, which are mounted in endwise relation to one another to provide the full length printhead array.

Important to printing applications is the stringent requirement placed on the uniformity of the intensity of light emission from the LED arrays used in the electronic/optical printer. In display applications for LED arrays, uniformity is not nearly as critical as in a printer because the eye is a logarithmic detector and is relatively insensitive to light intensity variations. However, in printing applications which involve relative movement of a photosensitive material past a linear array of LEDs, small intensity variations will manifest themselves in rasterbanding effects.

One factor associated with intensity variations from LED to LED is temperature. In order to obtain sufficient light output from the LED's to properly expose the recording medium, relatively high levels of current are provided to the printhead. As the temperature of the LED's is increased through production operations, efficiency of the LED's on production of light falls and additional current is required to offset this.

To this end, various proposals have been made to form more efficient LED's. In U.S. Pat. No. 4,617,192, the advantages of anti-reflection coatings on LED's are noted. As taught in this patent, an anti-reflection coating on an LED insures greater output of radiation from the LED, particularly where there is judicious selection of the coating material and its thickness. According to this patent, for a single layer anti-reflection coating with air as one of the optical mediums, optimum results can be obtained if the index of refraction of the anti-reflection coating is the square root of the index of refraction of the layer beneath the coating. Regarding thickness, the patent notes a relationship exists between thickness of the anti-reflection layer with wavelength of the radiation being transmitted.

U.S. Pat. No. 4,495,514 also notes the importance that thickness plays in an anti-reflection coating to minimize Fresnel reflections at the device-air interface.

In fabricating LED's, it is common practice to provide a dielectric mask over an n-type layer in which the p-n junction is formed. This mask is selectively etched away to form a window in which a p-type region is diffused into the n-type layer. In the course of diffusion down into the n-type layer there is also lateral diffusion of the p-type region into areas beneath the dielectric mask. Thereafter, an anti-reflection coating is applied over the window to improve light output efficiency. While the prior art recognizes that it is desirable to adjust the thickness of the anti-reflection coating over the window for optimum light output and recognizes that light is also output from the diffused areas beneath the mask, the presence of the mask is effectively ignored by considering same to be transmissive.

The inventors herein have noted that there is a fall-off in light output from the mask areas. In seeking to create more effective LED's, the inventors have investigated the reasons for this fall-off and determined that the mask may not be simply thought of as being transmissive but that a relationship exists between the combined thickness of mask layer and anti-reflection coating layer and that these can be optimized as well to significantly improve light output from this region of the LED to enhance light output by the LED.

SUMMARY OF THE INVENTION

The above and other problems associated with the prior art are overcome in a semiconductor light-emitting device that includes means defining one or more semiconductor layers for forming a light-emitting region when energized; a light transmissive mask layer means having an opening therein to define a window for use in diffusing a dopant into one of said semiconductor layers to form the light-emitting region; an anti-reflection layer being of a suitable thickness for covering said window is provided to enhance the amount of light emitted by said device through said window; and the improvement which comprises an anti-reflection layer overlying the mask layer at the periphery of the window so that the mask layer and anti-reflection layer are of a combined thickness to reduce to a minimum the internal reflection of light generated beneath said mask adjacent the periphery of the window.

DESCRIPTION OF THE ILLUSTRATIVE PREFERRED EMBODIMENTS

Figure 1:
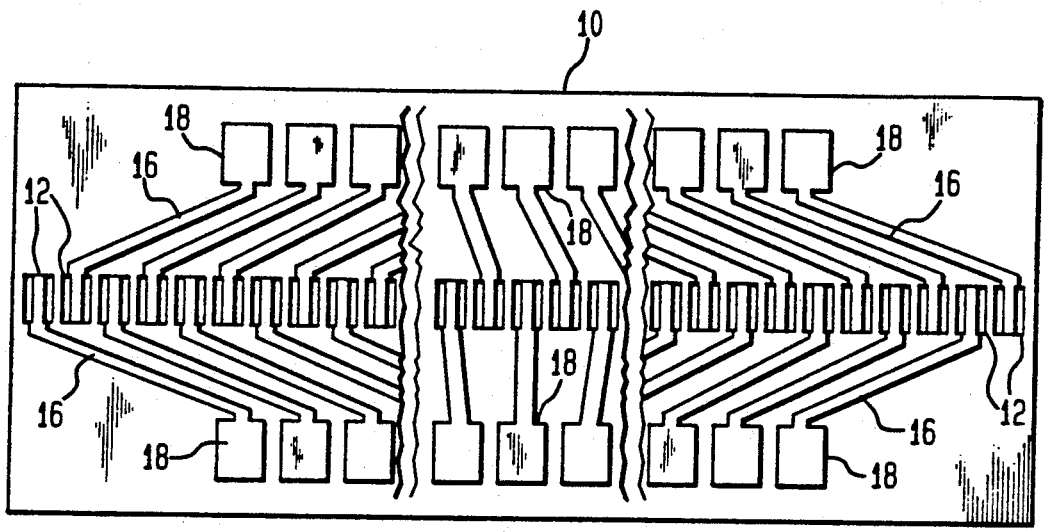
FIG. 1 is a fragmentary plan view of an LED array chip according to the prior art.
Figure 2:
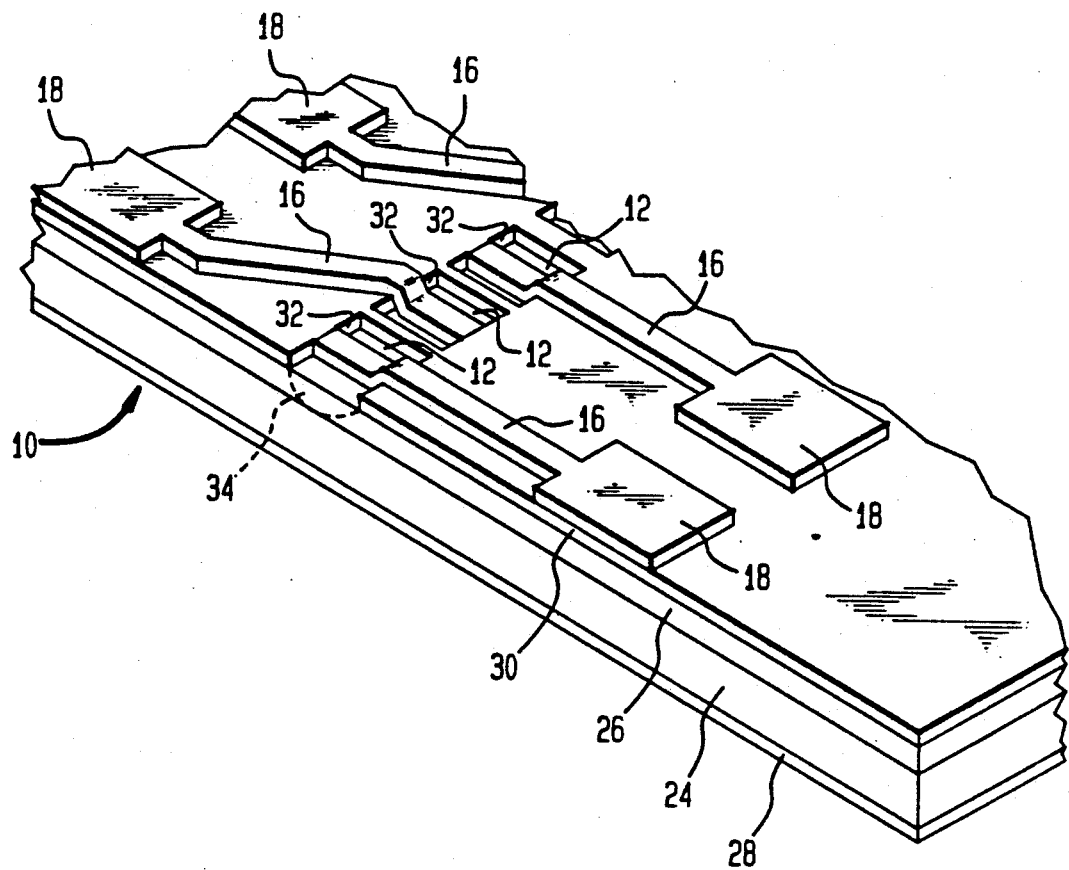
FIG. 2 is a fragmentary perspective view of a portion of the chip shown in FIG. 1.

An illustrative LED diode array chip 10 shown in FIGS. 1 and 2 is of elongate rectangular shape and includes a row of tiny and closely spaced individual light-emitting diodes 12. Each light-emitting diode, in turn, is energizable by means of a corresponding electrode structure comprising a narrow electrode strip 16 electrically connecting the diode to a wide bonding pad 18. To allow the bonding pads to be wider than the diodes, the electrode structures extend alternately in opposite directions from the successive diodes.

As shown in FIG. 2, the illustrative diode array chip comprises a substrate 24 made of gallium arsenide (GaAs) on which is formed an n-type epitaxial layer 26 of gallium arsenide phosphide (GaAsP). A common metallic electrode 28 is formed on the lower surface of substrate 24. The upper surface of epitaxial layer 26 is provided with a mask layer 30 of silicon nitride ($Si_3N_4$), which is provided with windows 32 that define the sites of the individual light-emitting diodes 12. After the mask layer 32 has been applied to the epitaxial layer 26, suitable dopants are diffused into the epitaxial layer through windows 32 to define diffused regions, as shown in numeral 34. The boundary between each such region and the surrounding undoped epitaxial layer material provides a p-n junction at which light is emitted.

The electrode structures, typically made of aluminum, are formed on the upper surface of the silicon nitride mask and traverse windows 32 in contact with the upper face of the doped epitaxial layer so that each light-emitting diode can be energized by current flowing between the corresponding electrode structure and the common electrode 28.

Figure 3:
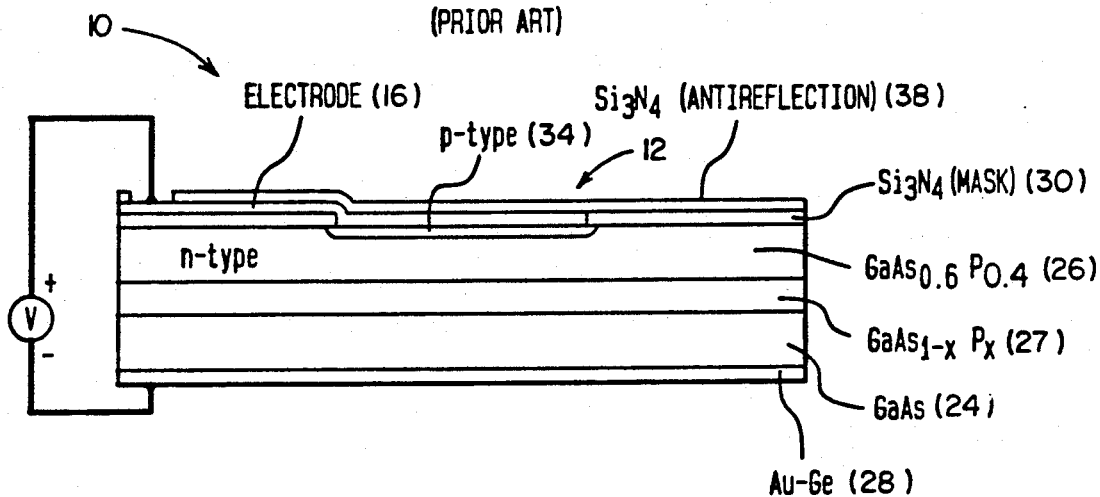
FIG. 3 is a cross-sectional view in schematic of the structure of an LED of the chip of FIG. 1 and showing greater details thereof.

With reference to FIG. 3, an anti-reflection layer, 38, not shown in FIG. 2 is then formed over the chip array and will be more particularly described below.

The foregoing description of the construction of the diode chip, per se, is simply illustrative and is typical of technology well known in the art, but the present invention is equally applicable to other types of diode array chips.

It should be appreciated that groups of these chip arrays are formed conventionally upon wafers which are then diced to form individual chip arrays of say 128 LED's. The chip arrays are then assembled end to end upon a suitable substrate(s) to form a linear array of LED's to comprise a printhead. In addition to this linear array of LED's, driver chips are coupled to the bonding pads to provide driving current to LED's selected for energization in accordance with image data signals fed to the driver chips.

FIG. 3 shows the construction of a prior art light-emitting diode wherein the p-n junction is formed in a layer of $GaAs_{0.6}P_{0.4}$ (gallium arsenide phosphide). The $GaAs_{0.6}P_{0.4}$ layer, 26, overlies a graded layer, 27, of $GaAs_{1-x}P_x$ that is grown by standard vapor phase epitaxy on a GaAs (gallium arsenide) substrate, 24. The alloy composition of the $GaAs_{1-x}P_x$ layer changes from $x=0$ (matching the GaAs substrate layer) to $x=0.4$ (matching the $GaAs_{0.6}P_{0.4}$ diode layer). A film, 30, of $Si_3N_4$ (silicon nitride) is deposited over the $GaAs_{0.6}P_{0.4}$ layer by plasma enhanced chemical vapor deposition techniques. A window, 32, is then etched by photolithographic techniques in the $Si_3N_4$ film, after which a p-type region, 34, is diffused into the n-type layer, 26, of $GaAs_{0.6}P_{0.4}$. Photolithographic techniques are then used to pattern a metal electrode, shown in FIGS. 1 and 2 as being comprised of aluminum. An electrical connection is provided to the GaAs substrate by a metal electrode, 16, comprised, for example, of alloyed gold-germanium (Au-Ge) or gold-tin (Au-Sn).

As discussed above, optical radiation is produced at the p-n junction upon the application of a forward bias voltage V. Not all of this radiation, however, will be emitted from the device. For example, in the case of the device shown in FIGS. 1 and 2, radiation produced in areas of the p-n junction which underlie the aluminum electrode will be lost as useful radiation because such areas are obstructed by the opaque (aluminum) electrode.

However, the use of an electrode finger that overlies the window provides greater electrode contact with the p-type region and increases radiant exitance in the central regions of the LED not covered by the electrode by reducing the "current crowding" phenomenon at the p-n junction.

A typical basic process for providing such LED array chips uses a substrate wafer comprising a layer of gallium arsenide supporting one or more epitaxial layers of gallium arsenide phosphide. A diffusion barrier layer of silicon nitride or some other glass-like material is then coated over the epitaxial layer and photolithographic techniques are used to produce a patterned photoresist on this layer so that an etching procedure can be employed to etch diode site openings through the diffusion barrier material, whereupon the photoresist material is completely removed. A dopant material, such as zinc, is then diffused into the gallium arsenide phosphide epitaxial layer using conventional semiconductor diffusion processes with the silicon nitride layer acting as a barrier to protect other regions of the epitaxial layer. A silicon dioxide barrier layer is provided at the frontside and backside of the wafer during the high temperature diffusion process. By providing excess holes in the doped epitaxial regions, the doping process defines each light-emitting site as a p-n junction in which the doped site is positive and the surrounding epitaxial material is negative by virtue of its inclusion of a trace material such as tellurium, which is added to the epitaxial layer in the process of producing the initial wafer with its epitaxial layer or layers. After the dopant procedure has been completed, the silicon dioxide barrier layer is removed and the wafer is then again covered with a photoresist pattern to define electrode regions. A metal, typically aluminum, is then deposited onto the wafer and a subsequent treatment causes the photoresist to swell and to lift the metal off the wafer except in the areas in which electrodes are desired. Finally, the entire wafer surface is coated with a hard anti-reflection coating, of silicon nitride or the like, to protect the chip and enhance the light output of the array chips. The reverse side of the wafer is then lapped to achieve controlled constant thickness of the wafer material (approximately 350 microns) and an ohmic contact material, typically comprising several layers of gold and other metals, is applied to the lower face of the wafer and the wafer is then heated to improve the ohmic contact on the lower wafer face. A photoresist material is then applied to the upper or diode face of the wafer by photolithographic means and the anti-reflective coating is etched away down to the electrode metal to define bond pad regions by which the diode array chip is connected to appropriate electronic energizing means.

Various methods can be employed for separating the individual array chips on the wafer, including sawing and scribing the wafer and then cleaving it along the scribe lines. This procedure can be employed either by scribing the top or the bottom surface of the wafer, but preferred cleaving methods are described in commonly assigned U.S. applications Ser. Nos. 07/439,919 and 07/439,920 and now U.S. Pat. Nos. 4,997,792 and 4,997,793, respectively.

As noted above and with reference to FIG. 4, zinc is diffused into the GaAsP from a zinc source located above the wafers. The zinc diffuses downwardly as well as laterally in the GaAsP layer. By carefully controlling many variables, especially the stress in the $Si_3N_4$ mask film, one can make the lateral diffusion approximately equal to the depth of diffusion, as one forms the p-n junctions. A typical junction depth is 3 microns ($\mu$).

Figure 5:
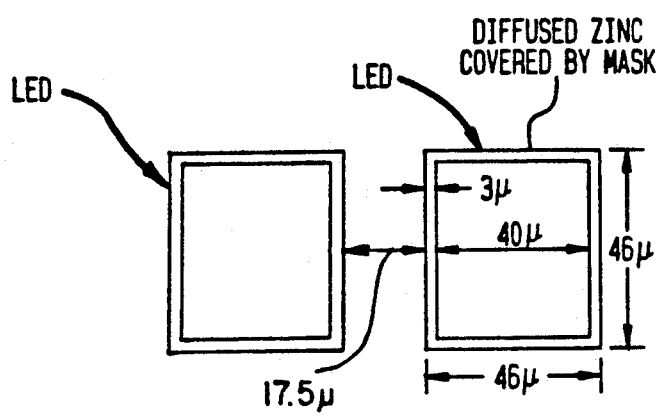
FIG. 5 is a sketch illustrating two LED's and indicating approximate dimensions of the LED's including a 3 micron portion covered by the mask layer.
Figure 6:
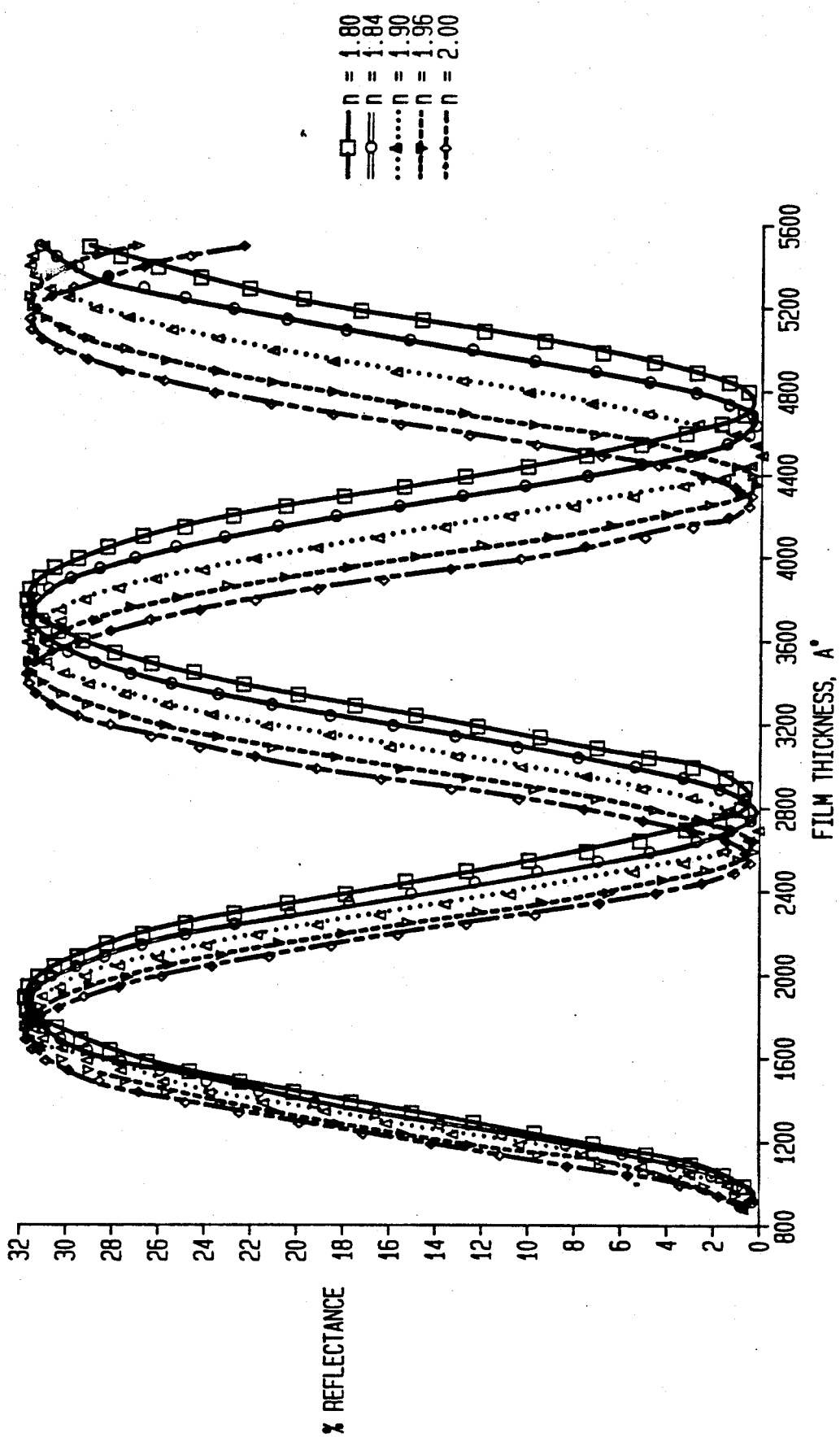
FIG. 6 is a sketch illustrating a relationship between reflectivity and anti-reflection film thickness.

Light is emitted from the point where the concentration of diffused zinc equals the background concentration. This may be called the p-n junction and it is at the bottom and sides of the diffused zinc region in FIGS. 4A and B. It may be noted from FIGS. 4 and 5 that the diffused zinc is in an area larger than the mask defined opening in the silicon nitride. Light emits from the $40\mu \times 40\mu$ area, and from the $3\mu$ ring around each diode area that is covered by the mask. Consider the light emitted from an unmasked window area of the LED that does not have an anti-reflection layer. Light is generated at the junction and some of it travels to the surface. That which meets the zinc-rich gallium arsenide phosphide to air interface at some angles is emitted externally and is captured by a suitable lens (not shown). Much of the light is internally reflected and dissipates as heat. In accordance with well known practice, an "anti-reflection" coating with a combination film thickness and index of refraction for the given wavelength of light generated in the epitaxial layer is applied such that the light, or more correctly, more of the light is emitted externally. As noted in FIG. 6, silicon nitride films have a reflectance minimum at 2700 Å (angstrom units) for index of refraction films $1.90 \pm 0.1$ for light of wavelength $685 \pm 5$ nm.

Figure 4A:
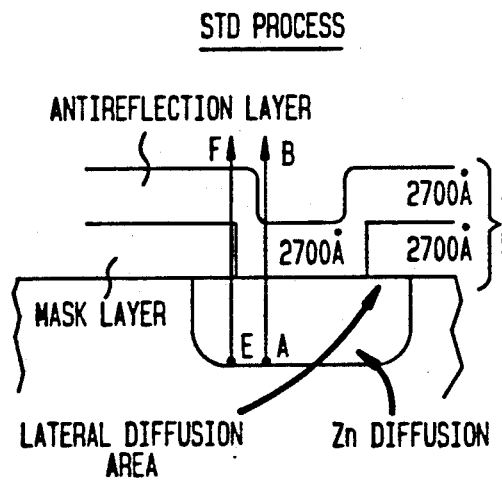
FIG. 4A is a blow-up of a portion of the structure shown in FIG. 3 with certain details omitted to improve clarity.
Figure 4B:
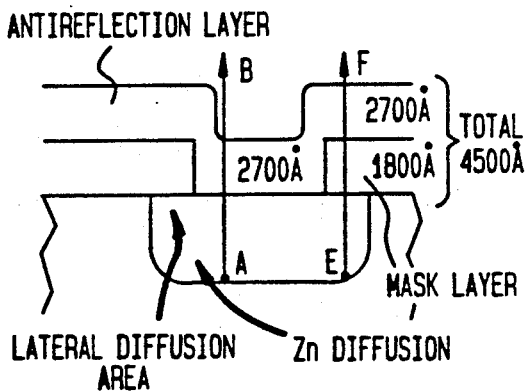
FIG. 4B is a blow-up illustrating the improved diode of the invention also with certain details omitted to improve clarity.

With reference to FIG. 4A, note what happens to a lightbeam created at point E. Light must pass through both the diffusion mask silicon nitride layer and the anti-reflection silicon nitride layer.

Figure 7:
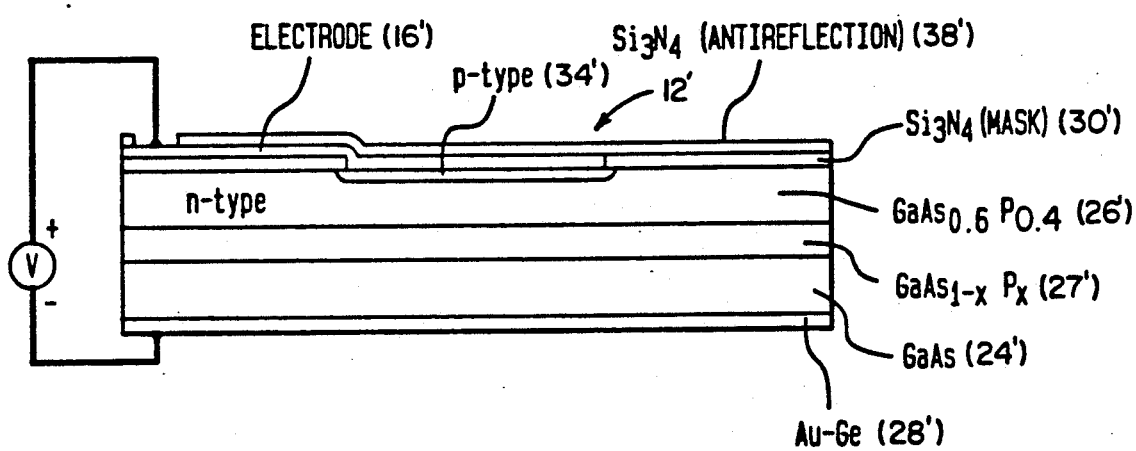
FIG. 7 is a view similar to that of FIG. 3 but illustrating the improved diode of the invention and wherein similar or corresponding structures to those of FIG. 3 are identified with a corresponding number followed with a prime (').

In a conventional diode fabrication process, the diffusion mask silicon nitride layer is chosen to be the same thickness as the anti-reflection silicon nitride layer for process convenience. We have noted that for light exiting from the zinc diffusion layer the total thickness along path E - F is thus $2700 \times 2 = 5400$ Å (angstrom units). Referring now to the % reflectivity vs. nitride film thickness graph of FIG. 6 reveals 5400 Å to be a high internal reflectance. In other words, much of the light generated in that $3\mu$ border around the $40\mu$ diode window is reflected back even though we have added the correct 2700 Å anti-reflection coating for the $40\mu \times 40\mu$ portion of the diode. As noted in FIGS. 4B and 7, the inventors propose that the diffusion mask silicon nitride thickness be changed to say for example 1800 Å (angstrom units), so that for light beams traversing the optical paths A to B and E to F are both at minimum reflectance points. This will enable a sharper edge of the diode (less attenuation in the final $3\mu$) and overall more light to get to the film. Note that a reflectance minimum is provided at 1800 Å + 2700 Å = 4500 Å.

As may be noted from the graph, various thicknesses will provide a reflectance minimum and hence a maximum of emittance. By considering the requirements for the window area and the mask plus window coating, selection of appropriate thicknesses can be made to optimize light output from the LED.

While the invention has been described with reference to a preferred embodiment employing a dielectric anti-reflection coating such as silicon nitride other materials are also known for such coatings such as $Al_2O_3$ (see U.S. Pat. No. 4,617,192). In U.S. Pat. No. 4,495,514, a transparent conductive layer serves both as an electrode and an anti-reflection coating and may also incorporate the teachings of our invention. Still other modifications may be incorporated into our invention using other diode types than that described herein including laser diodes.

As used herein, the word "light" refers to electromagnetic radiation that includes those portions of the electromagnetic spectrum that are visible to the eye as well as those that are not.

ADVANTAGES

Improved light output at the same current levels is provided for in a semiconductor light-emitting device such as an LED by considering light emitted from the diffused area beneath a mask layer. The combined thickness of the mask layer and anti-reflection layer are considered so that adjustment of the thickness of the mask layer to a dimension which when added to the dimension of the anti-reflection layer provides for a maximum emittance of light from the masked area of the device.

While the invention has been described with particular reference to preferred embodiments thereof, it will be understood that variations and modifications can be effected within the spirit and scope of the invention.

We claim:

1. In a semiconductor light-emitting device including means defining a semiconductor layer for forming a light-emitting region when energized;
    a light transmissive mask layer means having an opening therein defining a window for use in diffusing a dopant into said semiconductor layer to form the light-emitting region;
    an anti-reflection layer covering said window and being of a thickness to reduce to a minimum the internal reflection of light generated beneath said anti-reflection layer to enhance the amount of light emitted by said device through said window; and the improvement which comprises:
    the anti-reflection layer overlying the mask layer at the periphery of the window and the mask layer and anti-reflection layer being of a combined thickness to reduce to a minimum the internal reflection of light generated beneath said mask adjacent the periphery of the window.

2. The device of claim 1 and wherein the anti-reflection layer is a dielectric.

3. The device of claim 2 and wherein the mask layer and anti-reflection layers are each formed of silicon nitride and wherein the thickness of the anti-reflection layer overlying the mask area is about 2700 Å and the thickness of the mask layer is about 1800 Å.

4. The device of claims 1, 2 or 3 and wherein the semiconductor layer comprises an n-type graded layer of gallium arsenide phosphide and a p-type region diffused in the n-type layer.

5. In a light-emitting diode including
a substrate;
a layer of n-type semiconductor material supported on said substrate;
a light transmissive mask layer means of silicon nitride and having an opening thereon for defining a window through which a dopant was diffused to form a p-type semiconductor region;
an anti-reflection layer overlying said mask layer and said window to enhance light output from said window, the anti-reflection layer being a silicon nitride of about 2700 Å units in thickness, and the improvement which comprises:
the mask layer having a thickness of 1800 Å so that the combined thickness of mask layer and anti-reflection layer at the periphery of the window minimizes internal reflection of light generated beneath said mask layer adjacent the periphery of the window.

6. The diode of claim 5 and wherein the n-type material is gallium arsenide phosphide.

7. The diode of claim 5 and wherein the p-type semiconductor region has zinc diffused therein.

8. The light-emitting device of claims 1, 2, 3, and including means supporting a plurality of such devices in an assembly to form a printhead.

9. In a light-emitting device including a semiconductor material;
a mask layer overlying said material and having formed therein an opening defining a light-emitting window;
an anti-reflection layer overlying said window and the portion of the mask layer adjacent the window; and the improvement which comprises:
providing a combined thickness of mask layer and anti-reflection layer that provides a maximum of light emittance from regions beneath said mask layer at the periphery of the window, and the thickness of the anti-reflection layer overlying the window being different than the combined thickness of the mask layer and anti-reflection layer at the periphery but the thickness of the anti-reflection layer overlying the window being such as to provide a maximum of light emittance from the regions within the window.

10. The device of claim 9 and wherein the anti-reflection layer is a dielectric.

11. The device of claim 10 and wherein the mask layer and anti-reflection layers are each formed of silicon nitride and wherein the thickness of the anti-reflection layer overlying the mask layer is about 2700 Å and the thickness of the mask layer is 1800 Å.

* * * * *